(12) United States Patent
Pai

(10) Patent No.: US 8,895,872 B2
(45) Date of Patent: Nov. 25, 2014

(54) PRINTED CIRCUIT BOARD

(71) Applicant: Novatek Microelectronics Corp., Hsinchu (TW)

(72) Inventor: Yu-Chang Pai, Zhubei (TW)

(73) Assignee: Novatek Microelectronics Corp., Hsinchu (TW)

( * ) Notice: Subject to any disclaimer, the term of this patent is extended or adjusted under 35 U.S.C. 154(b) by 71 days.

(21) Appl. No.: 13/689,017

(22) Filed: Nov. 29, 2012

(65) Prior Publication Data

US 2013/0175078 A1    Jul. 11, 2013

(30) Foreign Application Priority Data

Jan. 9, 2012  (TW) .............................. 101100870 A

(51) Int. Cl.
*H05K 1/11*    (2006.01)
*H05K 1/02*    (2006.01)

(52) U.S. Cl.
CPC ............... *H05K 1/11* (2013.01); *H05K 1/0222* (2013.01); *H05K 1/0251* (2013.01); *H05K 1/0245* (2013.01)
USPC ............................ 174/262; 174/261; 174/250

(58) Field of Classification Search
CPC . H05K 1/0021; H05K 1/0219; H05K 1/0218; H05K 1/0216; H05K 1/0251; H05K 1/0245; H05K 1/0224; H05K 1/025; H05K 1/0253
USPC .......................................... 174/262, 250, 261
See application file for complete search history.

(56) References Cited

U.S. PATENT DOCUMENTS

| | | | |
|---|---|---|---|
| 6,710,258 B2 * | 3/2004 | Oggioni et al. ............... | 174/255 |
| 7,091,424 B2 * | 8/2006 | Oggioni et al. ............... | 174/262 |
| 7,166,877 B2 * | 1/2007 | Greeley ........................ | 257/259 |
| 7,317,166 B2 * | 1/2008 | Nakamura ..................... | 174/262 |
| 7,319,197 B2 * | 1/2008 | Oggioni et al. ............... | 174/262 |
| 7,360,308 B2 * | 4/2008 | Oggioni et al. ................ | 29/852 |
| 7,705,246 B1 * | 4/2010 | Pritchard et al. .............. | 174/262 |
| 8,013,427 B2 * | 9/2011 | Maetani ........................ | 257/664 |
| 8,035,992 B2 * | 10/2011 | Kushta et al. ................. | 361/818 |
| 8,421,551 B2 * | 4/2013 | Lascari .......................... | 333/33 |
| 8,426,743 B2 * | 4/2013 | Corisis et al. ................ | 174/260 |
| 2012/0152607 A1 * | 6/2012 | Chen et al. .................... | 174/266 |
| 2012/0325542 A1 * | 12/2012 | Yokoyama .................... | 174/262 |
| 2013/0112470 A1 * | 5/2013 | Ao ................................. | 174/266 |
| 2013/0175077 A1 * | 7/2013 | Kim et al. ..................... | 174/262 |

FOREIGN PATENT DOCUMENTS

| CN | 101553085 A | 10/2009 |
|---|---|---|
| TW | 2005037997 A | 11/2005 |

* cited by examiner

*Primary Examiner* — Hoa C Nguyen
*Assistant Examiner* — Amol Patel
(74) *Attorney, Agent, or Firm* — Rabin & Berdo, P.C.

(57) ABSTRACT

The printed circuit board comprises two first signal traces, a first grounding layer, two first signal traces, a second grounding layer, two signal conductive pillars and two grounding conductive pillars. The first signal traces are formed on a first surface of a substrate. The first grounding layer is formed on the first surface. The second signal traces are formed on a second surface of the substrate. The second grounding layer is formed on the second surface. The signal conductive pillars are extended to the second surface from the first surface and each signal conductive pillar connects the corresponding first signal trace and second signal trace. The grounding conductive pillars are extended to the second surface from the first surface and each grounding conductive pillar connects the first grounding layer and the second grounding layer. Each grounding conductive pillar and the corresponding signal conductive pillar are disposed in pairs.

14 Claims, 3 Drawing Sheets

PRINTED CIRCUIT BOARD

This application claims the benefit of Taiwan application Serial No. 101100870, filed Jan. 9, 2012, the subject matter of which is incorporated herein by reference.

BACKGROUND OF THE INVENTION

1. Field of the Invention

The invention relates in general to printed circuit board, and more particularly to printed circuit board having grounding conductive pillar.

2. Description of the Related Art

To avoid distortion of signal, a trace layer of a conventional printed circuit board (such as double-layered printed circuit board) is formed on the same side. If the trace layer is required to form on another side, the two opposite trace layer are connected by a conductive via.

However, it is helpless in promoting quality of transmitting high speed signal by purely using conductive via connecting the two opposite trace layer; contrarily, the impedance of transmission signal become inconsistent. For example, a difference of the impedance along transmission signal path becomes large.

SUMMARY OF THE INVENTION

The invention is directed to a printed circuit board of maintaining quality of transiting high speed signal during transiting high speed signal.

According to a first aspect of the present invention, a printed circuit board is provided. The printed circuit board comprises a base, two first signal traces, a first grounding layer, two second signal traces, a second grounding layer, two signal conductive pillars and two grounding conductive pillars. The base has a first surface and a second surface opposite to the first surface. The two first signal traces are formed on the first surface of the base. The first grounding layer is formed on the first surface of the base, wherein the first grounding layer is adjacent to the two first signal traces. The two second signal traces are formed on the second surface of the base. The second grounding layer is formed on the second surface of the base, wherein the second grounding layer is adjacent to the two second signal traces. The two signal conductive pillars are extended to the second surface of the base from the first surface of the base, wherein each signal conductive pillar is connected to the corresponding first signal trace and the second signal trace. The two grounding conductive pillars are extended to the second surface of the base from the first surface of the base, wherein each grounding conductive pillar is connected to the first grounding layer and the second grounding layer. Wherein, each signal conductive pillar and the corresponding grounding conductive pillar are disposed in pairs.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
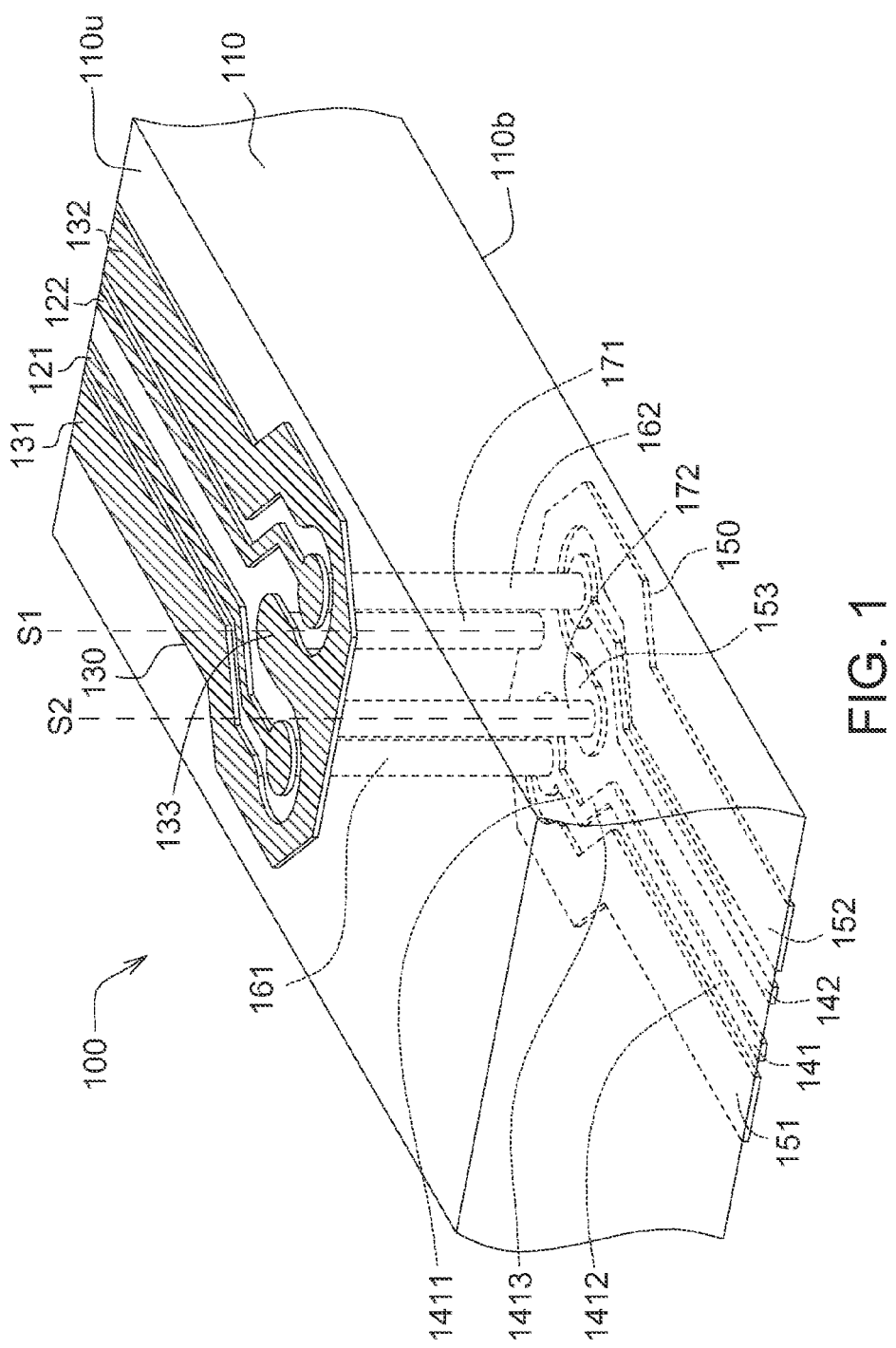
FIG. 1 illustrates a partial perspective view of a printed circuit board according to one embodiment of the invention.
Figure 2:
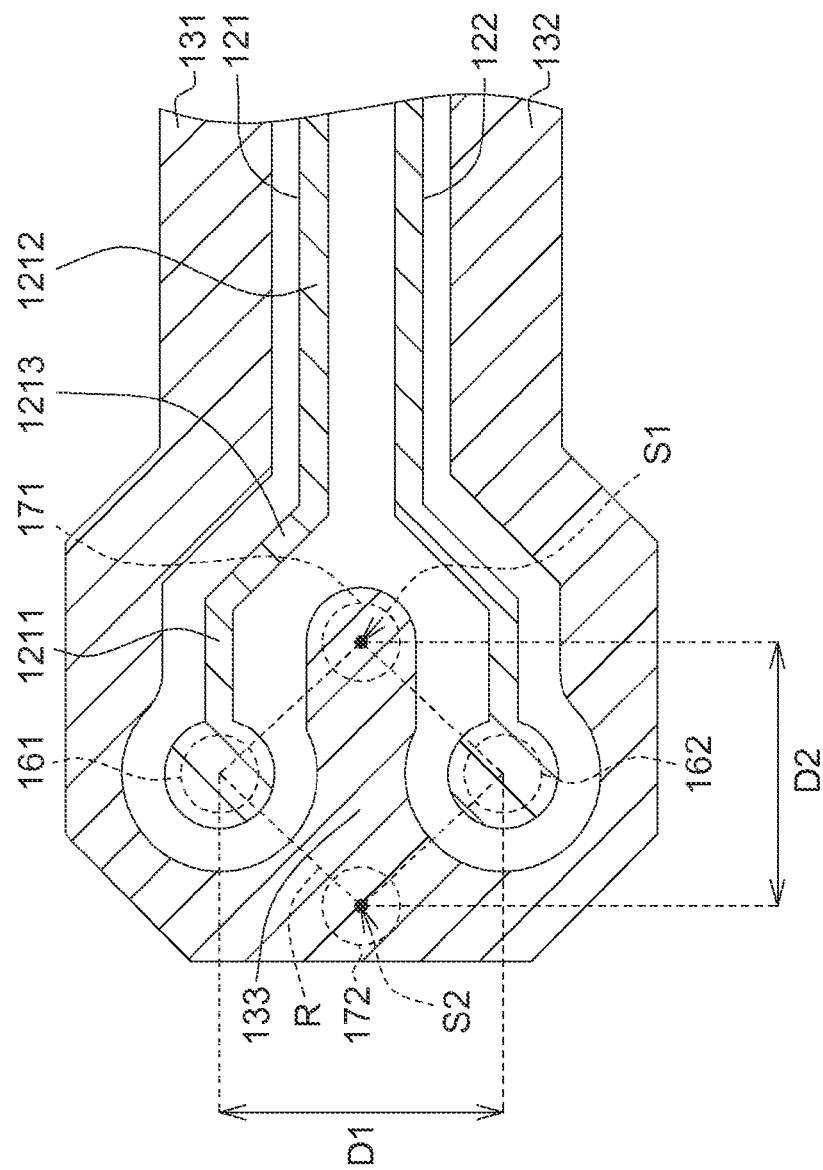
FIG. 2 illustrates a top view of a first grounding layer and a first signal trace layer of the printed circuit board of FIG. 1.

Referring to FIG. 1, a partial perspective view of a printed circuit board according to one embodiment of the invention is illustrated. Referring to FIG. 2, a top view of a first grounding layer and a first signal trace layer of the printed circuit board of FIG. 1 is illustrated.

As illustrated in FIG. 1, a printed circuit board 100, such as double-layered board, comprises a base 110, at least two first signal traces 121 and 122, a first grounding layer 130, at least two second signal traces 141 and 142, a second grounding layer 150, at least two signal conductive pillars 161 and 162 and at least two grounding conductive pillars 171 and 172.

The base 110 has a first surface 110$u$ and a second surface 110$b$ opposite to the first surface 110$u$. The first signal traces 121 and 122 are formed on the first surface 110$u$ of the base 110. The second signal traces 141 and 142 are formed on the second surface 110$b$ of the base 110. In one embodiment, a width of the first signal trace 121 and a width of the first signal trace 122 are such as 6 mil, and a width of the second signal trace 141 and a width of the second signal trace 142 are such as 6 mil.

The first grounding layer 130 is formed on the first surface 110$u$ of the base 110 and is adjacent to the first signal traces 121 and 122.

The second grounding layer 150 is formed on the second surface 110$b$ of the base 110 and is adjacent to the second signal traces 141 and 142.

As illustrated in FIG. 1, the grounding layer surrounds the signal trace in the same layer. For example, the first grounding layer 130 surrounds first signal traces 121 and 122, and the second grounding layer 150 surrounds second signal traces 141 and 142. Due to the grounding layer surrounds and is adjacent to the signal trace, quality of transiting high speed signal in the signal trace is excellent, such that quality of transiting high speed speed signal can be maintained or will not decrease too much.

The first grounding layer 130 is separated from the first signal traces 121 and 122. In one embodiment, a distance between the first grounding layer 130 and the first signal trace 121 ranges between 4~6 mil for example, and a distance between the first grounding layer 130 and the first signal trace 122 ranges between 4~6 mil for example. In addition, the second grounding layer 150 is separated form the second signal traces 141 and 142. In one embodiment, a distance between the second grounding layer 150 and the second signal trace 141 ranges between 4~6 mil for example, and a distance between the second grounding layer 150 and the second signal trace 142 ranges between 4~6 mil for example.

As illustrated in FIG. 1, the signal trace and the grounding layer at the same layer are disposed in pairs. For example, the first grounding layer 130 comprises a first sub-grounding layer 131 and a second sub-grounding layer 132. The first sub-grounding layer 131 is disposed adjacent to the first signal trace 121, such that the first sub-grounding layer 131 and the first signal trace 121 are disposed in pairs. The second sub-grounding layer 132 is disposed adjacent to the first signal trace 122, such that the second sub-grounding layer 132 and the first signal trace 122 are disposed in pairs. For example, the second grounding layer 150 comprises a third sub-grounding layer 151 and a fourth sub-grounding layer 152. The third sub-grounding layer 151 is disposed adjacent to the second signal trace 141, such that the third sub-grounding layer 151 and the second signal trace 141 are disposed in pairs. The fourth sub-grounding layer 152 is disposed adjacent to the second signal trace 142, such that the fourth sub-grounding layer 152 and the second signal trace 141 are disposed in pairs. As a result, quality of transiting high speed signal in the signal trace is excellent, such that quality of transiting high speed signal can be maintained or will not decrease too much.

As illustrated in FIG. 1, the first grounding layer 130 comprises a first connecting portion 133 connected to the two grounding conductive pillars 171 and 172. The second grounding layer 150 comprises a second connecting portion 153 connected to the two grounding conductive pillars 171 and 172.

As illustrated in FIG. 1, the first connecting portion 133 is located between the first sub-grounding layer 131 and the second sub-grounding layer 132 and connects the first sub-grounding layer 131 and the second sub-grounding layer 132. The second connecting portion 153 is located between the third sub-grounding layer 151 and the fourth sub-grounding layer 152 and connects the third sub-grounding layer 151 and the fourth sub-grounding layer 152.

The two signal conductive pillars 161 and 162 are extended to the second surface 110b of the base 110 from the first surface 110u of the base 110. Each of the signal conductive pillars 161 and 162 is connected to the corresponding first signal trace and second signal trace. For example, the signal conductive pillar 161 is connected to the corresponding first signal trace 121 and second signal trace 141, and the signal conductive pillar 162 is connected to the corresponding first signal trace 122 and second signal trace 142. In one embodiment, each of the signal conductive pillars 161 and 162 is such as 8 mil.

The two grounding conductive pillars 171 and 172 are extended to the second surface 110b of the base 110 from the first surface 110u of the base 110. Each grounding conducive pillar connects the first grounding layer and the second grounding layer. For example, the grounding conductive pillars 171 and 172 connect the first grounding layer 130 and the second grounding layer 150. In one embodiment, each of the grounding conductive pillars 171 and 172 is such as 8 mil.

As illustrated in FIGS. 1 and 2, an extension direction of a long axial of one of the two grounding conductive pillars passes through between the first signal traces. For example, an extension direction S1 of a long axial of the grounding conductive pillar 171 passes through between the first signal traces 121 and 122. In addition, an extension direction S2 of a long axial of the grounding conductive pillar 172 passes through an exterior of the first signal traces 121 and 122; however, such exemplification not meant to be limiting. In another embodiment, as long as the grounding conductive pillar 171 and/or 172 is changed, the extension direction S2 of the long axial of the grounding conductive pillar 172 can pass through between the first signal traces 121 and 122.

An extension direction of a long axial of another of the two grounding conductive pillars passes through between the second signal traces. For example, an extension direction S2 of a long axial of the grounding conductive pillar 171 passes through between the second signal traces 141 and 142. In addition, an extension direction S1 of a long axial of the grounding conductive pillar 171 passes through an exterior of the second signal traces 141 and 142; however, such exemplification not meant to be limiting. In another embodiment, as long as the grounding conductive pillar 171 and/or 172 is changed, the extension direction S1 of the long axial of the grounding conductive pillar 171 can pass through between the second signal traces 141 and 142.

As illustrated in FIG. 2, the signal conductive pillar and the grounding conductive pillar are disposed in pairs. For example, the two signal conductive pillars 161, 162 and the two grounding conductive pillars 172, 172 are arranged corresponding to four corners of a quadrangle, that is, the positions of the end surfaces (or cross-sectional surfaces) of the signal conductive pillars 161, 162 and the two grounding conductive pillars 172, 172 are arranged corresponding to four corners of a quadrangle R. The quadrangle R is such as rectangle, diamond or trapezoid. As a result, each signal conductive pillar and the corresponding grounding conductive pillar are disposed in pairs, such that quality of transiting high speed signal can be promoted during a high speed signal transited to one the first surface 110u and the second surface 110b from another the first surface 110u and the second surface 110b through the signal conductive pillar and the grounding conductive pillar.

As illustrated in FIG. 2, any of the signal conductive pillars 161 and 162 is adjacent to any the grounding conductive pillars 171 and 172. In present embodiment, the two signal conductive pillars 161 and 162 are disposed in pairs, and the two grounding conductive pillars 171 and 172 are disposed in pairs. For example, the two signal conductive pillars 161 and 162 are disposed corresponding to a pair corner of a quadrangle R, and the two grounding conductive pillars 171 and 172 are disposed corresponding to another corner of the quadrangle R.

As illustrated in FIG. 2, a distance D1 between the signal conductive pillars 161 and 162 is substantially equal to a distance D2 between the grounding conductive pillars 171 and 172; however, such exemplification not meant to be limiting.

As illustrated in FIG. 2, each first signal trace has several bending portions. Take the first signal trace 121 for example, the first signal trace 121 comprises a first sub-trace 1211, a second sub-trace 1212 and a third sub-trace 1213. The second sub-trace 1212 is substantially parallel to the first sub-trace 1211. The third sub-trace 1212 connects the first sub-trace 1211 and the second sub-trace 1212. The structure of the first signal trace 122 is similar to the first signal trace 121, and the similarities are not repeated here. Take the second signal trace 141 for example, the second signal trace 141 (FIG. 1) comprises a fourth sub-trace 1411 (FIG. 1), a fifth sub-trace 1412 (FIG. 1) and a sixth sub-trace 1413 (FIG. 1). The fifth sub-trace 1412 is substantially parallel to the fourth sub-trace 1411. The sixth sub-trace 1413 connects the fourth sub-trace 1411 and the fifth sub-trace 1412. The structure of the second signal trace 142 is similar to the second signal trace 141, and the similarities are not repeated here.

Figure 3:
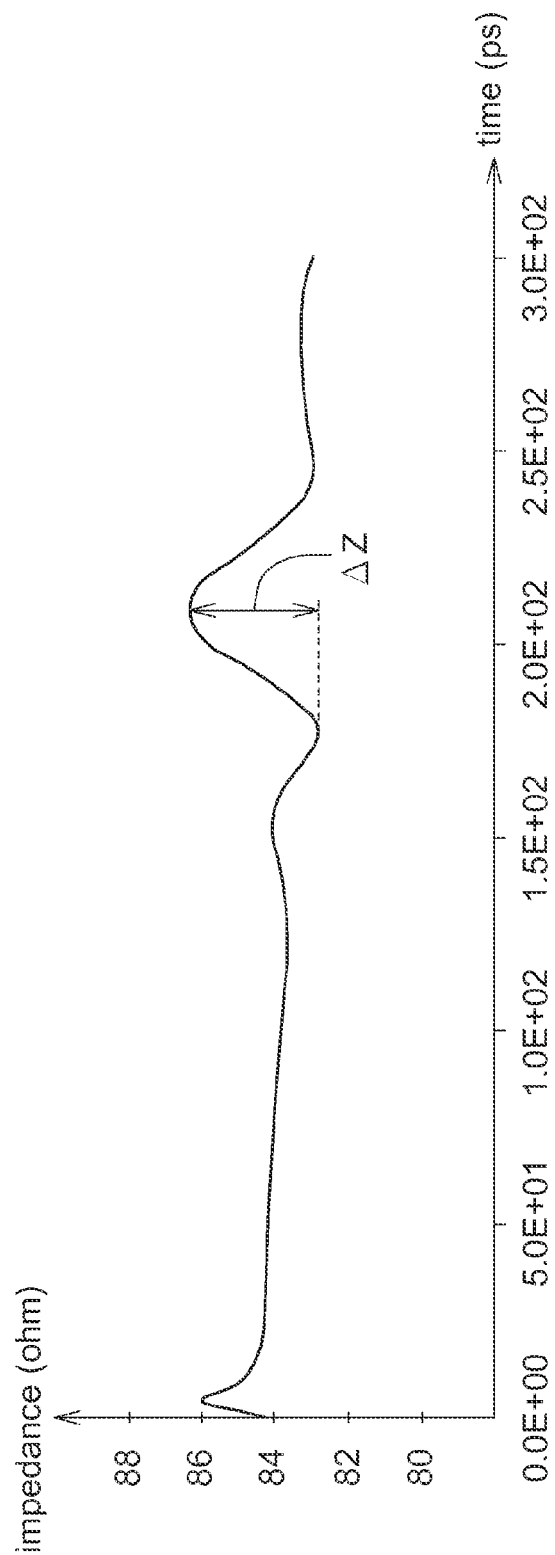
FIG. 3 illustrates a graph illustrating an analysis result of the impedance for the printed circuit board of FIG. 1.

Referring to FIG. 3, a graph illustrating an analysis result of the impedance for the printed circuit board of FIG. 1 is illustrated. In present embodiment, due to the signal trace and the grounding structure are disposed in pairs, a difference $\Delta Z$ of impedance is very low when a signal transited a path between the first signal trace (such as the first signal trace 121 and/or 122) and the second signal trace (such as the second signal trace 141 and/or 142) through the signal conductive pillars 161 and 162. As a result, the impedance for signal along transmission path is close or identical, such that the quality of transiting high speed signal is promoted. In one embodiment, a difference $\Delta Z$ of the impedance may be lower than 3.5 ohm.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A printed circuit board, comprising:
a base, having a first surface and a second surface opposite to the first surface;
two first signal traces, formed on the first surface of the base;
a first grounding layer, formed on the first surface of the base, wherein the first grounding layer is adjacent to the two first signal traces;
two second signal traces, formed on the second surface of the base;
a second grounding layer, formed on the second surface of the base, wherein the second grounding layer is adjacent to the two second signal traces;
two signal conductive pillars, extended to the second surface of the base from the first surface of the base, wherein each signal conductive pillar connects the corresponding first signal trace and the second signal trace; and
two grounding conductive pillars, extended to the second surface of the base from the first surface of the base, wherein each grounding conductive pillar connects the first grounding layer and the second grounding layer, and an extension direction of a long axial of one of the two grounding conductive pillars passes through between the two first signal traces;
wherein each signal conductive pillar and the corresponding grounding conductive pillar are disposed in pairs.

2. The printed circuit board according to claim 1, wherein the two signal conductive pillars are disposed in pairs, and the two grounding conductive pillars are disposed in pairs.

3. The printed circuit board according to claim 1, wherein a distance between the two signal conductive pillars is substantially equal to a distance between the two grounding conductive pillars.

4. The printed circuit board according to claim 1, wherein the first grounding layer surrounds the two first signal traces.

5. The printed circuit board according to claim 1, wherein the second grounding layer surrounds the two second signal traces.

6. The printed circuit board according to claim 1, wherein each first signal trace comprising:
a first sub-trace;
a second sub-trace, being substantially parallel to the first sub-trace; and
a third sub-trace, connecting the first sub-trace and the second sub-trace.

7. The printed circuit board according to claim 1, wherein each second signal trace comprising:
a fourth sub-trace;
a fifth sub-trace, being substantially parallel to the fourth sub-trace; and
a sixth sub-trace, connecting the fourth sub-trace and the fifth sub-trace.

8. The printed circuit board according to claim 1, wherein the first grounding layer comprising a first connecting portion connected to the two grounding conductive pillars.

9. The printed circuit board according to claim 1, wherein the first grounding layer comprising a second connecting portion connected to the two grounding conductive pillars.

10. The printed circuit board according to claim 1, wherein the first grounding layer comprising:
a first sub-grounding layer, disposed adjacent to one of the two first signal traces; and
a second sub-grounding layer, disposed adjacent to another of the two first signal traces.

11. The printed circuit board according to claim 1, wherein the second grounding layer comprising:
a third sub-grounding layer, disposed adjacent to one of the two second signal traces; and
a fourth sub-grounding layer, disposed adjacent to another of the two second signal traces.

12. The printed circuit board according to claim 1, wherein an extension direction of a long axial of another of the two grounding conductive pillars passes through an exterior of the two first signal traces.

13. The printed circuit board according to claim 1, wherein an extension direction of a long axial of another of the two grounding conductive pillars passes through between the two second signal traces.

14. The printed circuit board according to claim 13, wherein the extension direction of the long axial of the one of the two grounding conductive pillars passes through an exterior of the two second traces.

* * * * *